United States Patent
Chang et al.

(10) Patent No.: US 9,577,614 B2
(45) Date of Patent: Feb. 21, 2017

(54) DETECTING METHOD AND DEVICE FOR SUPPRESSING INTERFERENCE OF LOW-FREQUENCY NOISE

(71) Applicant: EGALAX_EMPIA TECHNOLOGY INC., Taipei (TW)

(72) Inventors: Chin-Fu Chang, Taipei (TW); Shang-Tai Yeh, Taipei (TW); Guang-Huei Lin, Taipei (TW); Po-Chuan Lin, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 768 days.

(21) Appl. No.: 13/889,436

(22) Filed: May 8, 2013

(65) Prior Publication Data
US 2013/0314370 A1    Nov. 28, 2013

Related U.S. Application Data

(60) Provisional application No. 61/643,951, filed on May 8, 2012.

(51) Int. Cl.
| G06F 3/045 | (2006.01) |
| H03K 3/013 | (2006.01) |
| G06F 3/044 | (2006.01) |
| G11C 27/02 | (2006.01) |
| G06F 3/041 | (2006.01) |
| G06F 3/0354 | (2013.01) |

(52) U.S. Cl.
CPC .......... *H03K 3/013* (2013.01); *G06F 3/03545* (2013.01); *G06F 3/044* (2013.01); *G06F 3/0418* (2013.01); *G11C 27/026* (2013.01)

(58) Field of Classification Search
CPC .... H03K 3/013; G06F 3/04545; G06F 3/0418; G06F 3/044; G11C 27/026
USPC .................................................. 345/173–174
See application file for complete search history.

(56) References Cited

U.S. PATENT DOCUMENTS

| 4,488,052 A * | 12/1984 | Zappen ................ H04N 5/2173 |
| | | 250/208.1 |
| 5,159,340 A * | 10/1992 | Smith ..................... H03M 1/48 |
| | | 235/462.27 |
| 2006/0022719 A1* | 2/2006 | Hill ........................ H03K 5/007 |
| | | 327/58 |
| 2008/0149402 A1* | 6/2008 | Vos ..................... G06F 3/03545 |
| | | 178/19.01 |
| 2008/0156546 A1* | 7/2008 | Hauck ................. G06F 3/03545 |
| | | 178/19.01 |
| 2008/0204322 A1* | 8/2008 | Oswald ..................... G01S 5/04 |
| | | 342/465 |

* cited by examiner

*Primary Examiner* — Kent Chang
*Assistant Examiner* — Mark Edwards
(74) *Attorney, Agent, or Firm* — WPAT, PC; Justin King; Douglas Hosack (57) ABSTRACT

The invention detects the difference between the maximum signal and the minimum signal at each of a plurality of cycles separately when a sine wave is received. All differences are summed for generating a single detected signal for suppressing the interference of low-frequency noise. No synchronization with the sine wave is necessary and the detection can start at any phase of the sine wave.

20 Claims, 5 Drawing Sheets

DETECTING METHOD AND DEVICE FOR SUPPRESSING INTERFERENCE OF LOW-FREQUENCY NOISE

CROSS REFERENCE TO RELATED PATENT APPLICATION

This patent application claims the domestic priority of the U.S. provisional application 61/643,951 filed on May 8, 2012, and hereby incorporated by reference.

BACKGROUND OF THE INVENTION

1. Field of the Invention

The present invention relates to a signal detecting method and device, and more particularly, to a detecting method and device for suppressing the interference of low-frequency noise.

2. Description of the Prior Art

Figure 1A:
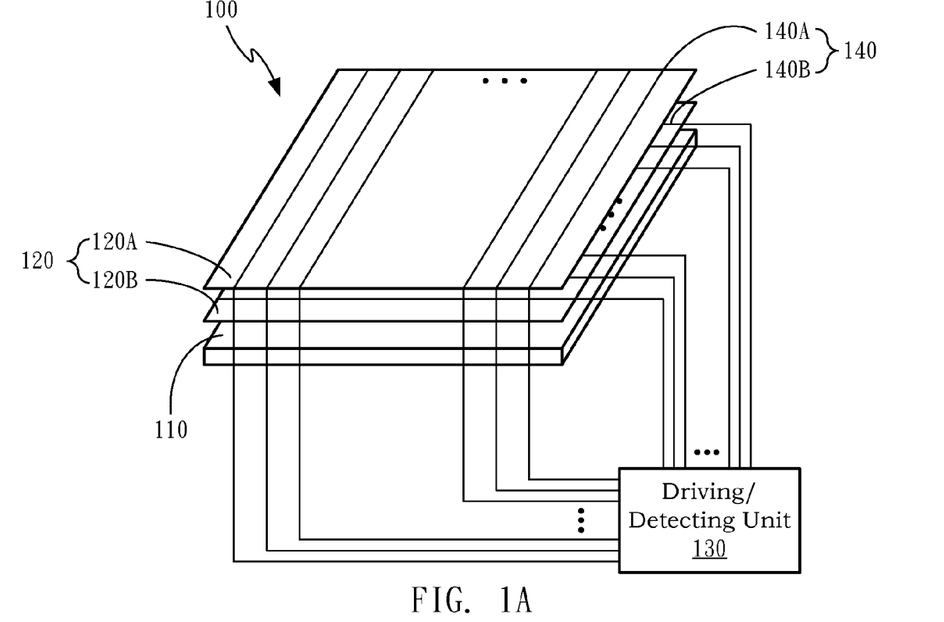
FIGS. 1A and 1B are schematic diagrams illustrating mutual capacitive detectors.
Figure 1B:
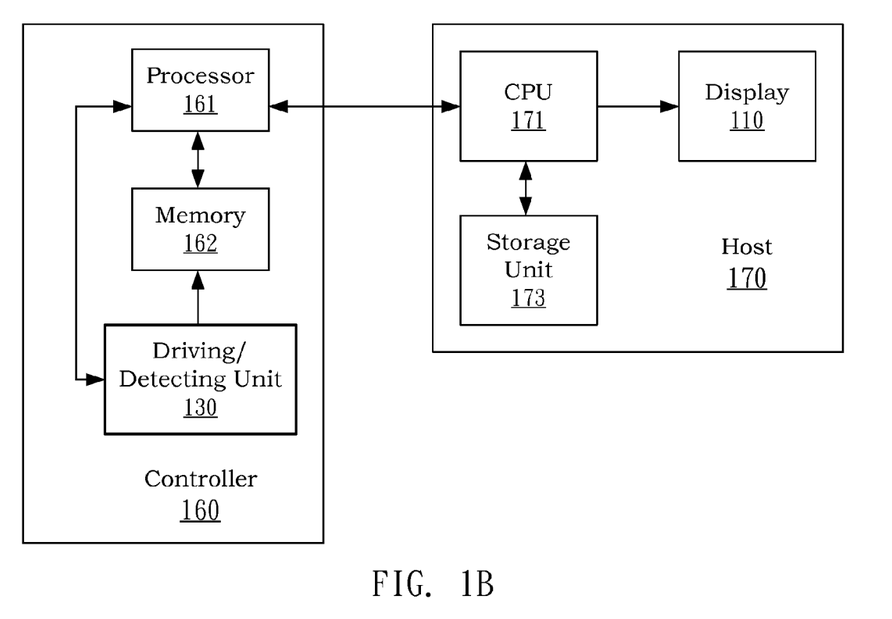
Figure 1C:
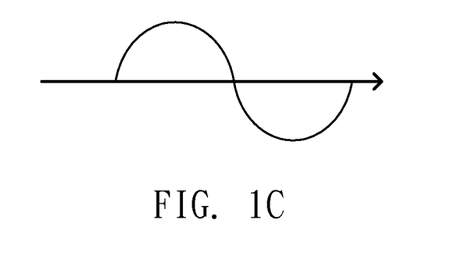
FIG. 1C is a schematic diagram illustrating a sine wave.

When a signal such as the one shown in FIG. 1C is received under the interference of low-frequency noise, this signal may become distorted. The signal is, for example, used as a driving signal for a capacitive touch sensor. The capacitive touch sensor includes a plurality of detecting electrodes. When the driving signal is provided to one or more of the detecting electrodes, self-capacitive coupling by the detecting electrodes themselves, or mutual-capacitive coupling between the electrodes may be generated. When an external conductive object approaches or touches the capacitive touch screen, changes in capacitive coupling will occur in some of the detecting electrodes. Through this change in capacitive coupling, the location of the external conductive object can be determined.

However, low-frequency noise may easily inject into the capacitive touch sensor through the external conductive object, it may distort the change in capacitive coupling described before, thereby creating errors in the determination of the location of the external conductive object.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

In view of the above, low-frequency noise may interfere with the received signals. In the present invention, upon receiving a sine wave, the difference between the maximum and the minimum signals at each of a plurality of cycles is detected, and all the differences between the maximum and the minimum signals are then summed together to generate a single detected signal. This suppresses the interference of low-frequency noise. Moreover, the present invention requires no synchronization with the input signal, and signal detection can start at any arbitrary phase of the input signal.

The above and other objectives of the present invention can be achieved by the following technical scheme. A writing detecting device for suppressing interference of low-frequency noise in accordance with the present invention may include: a pointing device for providing a sine wave with a fixed period; a touch screen including a plurality of conductive strips composed of a plurality of vertical conductive strips and a plurality of horizontal conductive strips for receiving the sine wave through capacitively coupling; and a controller including: a detecting circuit for starting at least one signal detection at any arbitrary phase of the received sine wave, each signal detection lasting for a cycle, wherein the detecting circuit includes: a first signal filtering circuit for filtering out a maximum signal at each signal detection; a second signal filtering circuit for filtering out a minimum signal at each signal detection; and a signal difference generating circuit for generating a respective signal difference between the maximum and the minimum signals for each signal detection; and a summing circuit for summing all the signal differences for the at least one signal detection to generate a complete detected signal.

The above and other objectives of the present invention can further be achieved by the following technical scheme. A detecting method for suppressing interference of low-frequency noise in accordance with the present invention may include: receiving a sine wave with a fixed period; starting at least one signal detection at any arbitrary phase of the received sine wave, each signal detection lasting for a cycle and including: detecting a maximum signal and a minimum signal; and calculating the signal difference between the maximum and the minimum signals; and summing all the signal differences for the at least one signal detection to generate a complete detected signal.

The above and other objectives of the present invention can further be achieved by the following technical scheme. A detecting device for suppressing interference of low-frequency noise in accordance with the present invention may include: a receiving circuit for receiving a sine wave; a detecting circuit for starting at least one signal detection at any arbitrary phase of the received sine wave, each signal detection lasting for a cycle, wherein the detecting circuit includes: a first signal filtering circuit for filtering out a maximum signal at each signal detection; a second signal filtering circuit for filtering out a minimum signal at each signal detection; and a signal difference generating circuit for generating a respective signal difference between the maximum and the minimum signals for each signal detection; and a summing circuit for summing all the signal differences for the at least one signal detection to generate a complete detected signal.

With the above technical schemes, the present invention includes at least the following advantages and beneficial effects:

1. The interference of low-frequency noise can be effectively suppressed by detecting the difference between the maximum and the minimum signals at each of a plurality of cycles and summing all the differences between the maximum and the minimum signals; and 2. No synchronization with the input signal is necessary and the signal detection can start at any arbitrary phase of the input signal.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

Referring to FIG. 1A, a position detecting device 100 applicable to the present invention is shown, which includes a sensing device 120 and a driving/detecting unit 130. The sensing device 120 has a sensing layer. In an example of the present invention, the sensing layer can include a first sensing layer 120A and a second sensing layer 120B. The first and second sensing layers 120A and 120B each has a plurality of conductive strips 140, wherein the first conductive strips 140A of the first sensing layer 120A and the second conductive strips 140B of the second sensing layer 120B cross each other. In another example of the present invention, the first and second conductive strips 140A and 140B are disposed on a co-planar sensing layer. The driving/detecting unit 130 produces sensing information based on signals of the conductive strips 140. In the case of self-capacitive detection, for example, conductive strips 140 that are being driven are detected. In the case of mutual-capacitive detection, some of the conductive strips 140 that are not being directly driven by the driving/detecting unit 130 are detected. In addition, the sensing device 120 can be disposed on a display 110. An optional rear shielding layer (not shown) can be interposed between the sensing device 120 and the display 110. In a preferred example of the present invention, there is no rear shielding layer between the sensing device 120 and the display 110 so as to reduce the thickness of the sensing device 120.

The first and second conductive strips can be a plurality of column conductive strips and row conductive strips arranged in columns and rows; a plurality of first dimensional conductive strips and second dimensional conductive strips arranged in first and second dimensions; or a plurality of first axial conductive strips and second axial conductive strips arranged in first and second axes. In addition, the first and second conductive strips can be arranged in orthogonal or non-orthogonal directions. For example, in a polar coordinate system, one of the first and second conductive strips can be arranged in radial direction, and the other one of the first and second conductive strips can be arranged in circular direction. Furthermore, one of the first and second conductive strips can be driving conductive strips, while the other one of the first and second conductive strips can be detecting conductive strips. Said "first dimension" and "second dimension", "first axis" and "second axis", "driving" and "detecting", "driven" or "detected" conductive strips can be used to mean said "first and "second" conductive strips, including but not limited to, being arranged in orthogonal grids, and in any other geometric configurations comprising first dimensional and second dimensional intersecting conductive strips.

The position detecting device 100 of the present invention can be applied to a computing system as shown in FIG. 1B, which includes a controller 160 and a host 170. The controller includes the driving/detecting unit 130 to operatively couple the sensing device 120 (not shown). In addition, the controller 160 can include a processor 161 for controlling the driving/detecting unit 130 in generating the sensing information. The sensing information can be stored in a memory 162 and accessible by the processor 161. Moreover, the host 170 constitutes the main body of the computing system, and mainly includes a central processing unit 171, a storage unit 173 that can be accessed by the central processing unit 171, and the display 110 for displaying results of operations.

In another example of the present invention, there is a transmission interface between the controller 160 and the host 170. The controlling unit transmits data to the host via the transmission interface. One with ordinary skill in the art can appreciate that the transmission interface may include, but not limited to, UART, USB, I2C, Bluetooth, Wi-Fi, IR and other wireless or wired transmission interfaces. In an example of the present invention, data transmitted can be positions (e.g. coordinates), identified results (e.g. gesture codes), commands, sensing information or other information provided by the controller 160.

In an example of the present invention, the sensing information can be initial sensing information generated under the control of the processor 161, and this information is passed onto the host 170 for position analysis, such as position analysis, gesture determination, command identification, and so on. In another example of the present invention, the sensing information can be analyzed by processor 161 first before forwarding the determined positions, gestures, commands, or the like to the host 170. The present invention does not limit to this example, and one with ordinary skill in the art can readily recognize other interactions between the controller 160 and the host 170.

At each intersection of the conductive strips, the upper and lower conductive strips form the positive and negative electrodes. Each intersection can be regarded as one pixel in an image. When one or more external conductive objects approach or touch the sensing device, said image can be regarded as a photographed touch image (e.g. the pattern of a finger upon touching the sensing device).

When a driven conductive strip is being provided with a driving signal, the driven conductive strip itself produces self capacitance, and produces mutual capacitance on each intersection of the driven conductive strip. Said self-capacitive detection is detecting the self-capacitance of all the conductive strips, which is particularly useful in determining approach or touch of a single external conductive object.

In said mutual-capacitive detection, when a driven conductive strip is being provided with a driving signal, capacitances or changes in capacitances of all intersections on the driven conductive strip are detected with all sensed conductive strips arranged in different dimensions to the driven conductive strip, and are regarded as a row of pixels. Accordingly, all the rows of pixels are combined to form said image. When one or more external conductive objects approach or touch the sensing device, said image can be regarded as a photographed touch image, which is particularly useful in determining approaches or touches of a plurality of external conductive objects.

These conductive strips (the first and second conductive strips) can be made of transparent or opaque materials, such as transparent Indium Tin Oxide (ITO). In terms of the structure, it can be categorized into a Single ITO (SITO) structure and a Double ITO (DITO) structure. One with ordinary skill in the art can appreciate that other materials can be used as the conductive strips, such as carbon nanotube, and they will not be further described.

In an example of the present invention, the horizontal direction is regarded as the first direction, while the vertical direction is regarded as the second direction. Thus, the horizontal conductive strips are the first conductive strips, and the vertical conductive strips are the second conductive strips. However, one with ordinary skill in the art can appreciate that the above is merely an example of the present invention, and the present invention is not limited to this. For example, the vertical direction can be regarded as the first direction, while the horizontal direction can be regarded as the second direction.

During 2D mutual capacitive detection, alternating driving signals are sequentially provided to each first conductive strip, and 1D sensing information corresponding to each driven first conductive strip is obtained from the signals of the second conductive strips. Sensing information of all the first conductive strips are combined together to form 2D sensing information. 1D sensing information can be generated based on the signal of a second conductive strip, or based on the difference between the signal of a conductive strip and a reference value. In addition, the sensing information can be generated based on current, voltage, level of capacitive coupling, amount of charge or other electrical characteristics, and can be in analog or digital form.

When there is no external object actually approaching or covering the touch sensor, or when the system has not determined any external object actually approaching or covering the touch sensor, the position detecting device may generate a reference value based on the signals of the second conductive strips. This reference value represents stray capacitance on the touch sensor. Sensing information can be generated based on the signal of a second conductive strip or the result of subtracting the reference value from the signal of the second conductive strip.

Figure 2:
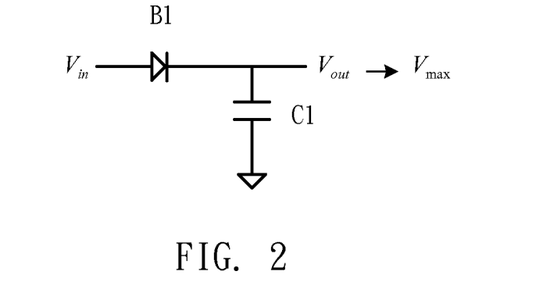
FIGS. 2 and 4 are schematic diagrams illustrating a first signal filtering circuit in accordance with the present invention.
Figure 3:
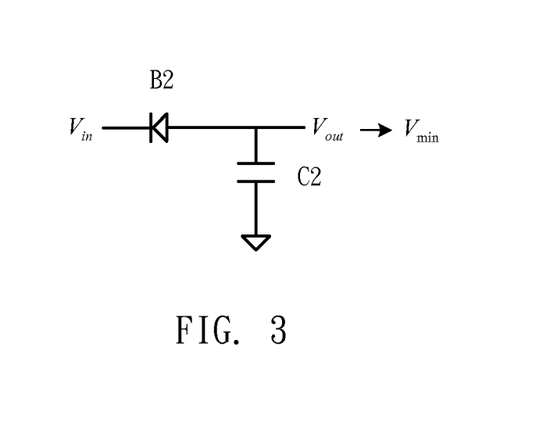
FIGS. 3 and 5 are schematic diagrams illustrating a second signal filtering circuit in accordance with the present invention.

Referring to FIGS. 2 and 3, signal filtering circuits in accordance with a first embodiment of the present invention are shown. To address the noise interference issue described in the prior art, the present invention proposes that a plurality of cycles of the input signal are detected, and only the maximum and the minimum signals in each cycle are detected. In a best mode of the present invention, the input signal is a sine wave.

When the input signal is affected by low-frequency noise, the input signal is carried on the low-frequency signal, so the input signal will undulate with the low-frequency noise. Assuming that the difference between the amounts of interferences experienced by the first half and the second half of each cycle by the low-frequency noise is small, then the difference between the signal difference between the maximum and the minimum signals within the same cycle when the low-frequency noise is present and the signal difference between the maximum and the minimum signals within the same cycle when the low-frequency noise is not present will also be small. Moreover, detecting a plurality of cycles can reduce said difference.

In order to obtain the maximum and the minimum signals in a cycle, an example of the present invention is to employ the signal filtering circuits shown in FIGS. 2 and 3. An input signal Vin is provided to the circuits of FIGS. 2 and 3. In the positive half cycle, the input signal Vin will pass through a first diode B1 of the signal filtering circuit of FIG. 2, and is held by a first capacitor C1 until the maximum signal Vmax is held by the first capacitor C1. Therefore, the maximum signal Vmax can be obtained by an output signal Vout of the signal filtering circuit of FIG. 2. Similarly, in the negative half cycle, the input signal Vin will pass through a second diode B2 of the signal filtering circuit of FIG. 3, and is held by a second capacitor C2 until the minimum signal Vmin is held by the second capacitor C2. Therefore, the minimum signal Vmin can be obtained by an output signal Vout of the signal filtering circuit of FIG. 3.

However, diodes tend to have very large forward-bias limitations in integrated circuits. A typical forward-bias voltage is around 0.7 V. If the input signal is possibly less than or less than the forward-bias voltage, then it cannot be detected.

Figure 4:
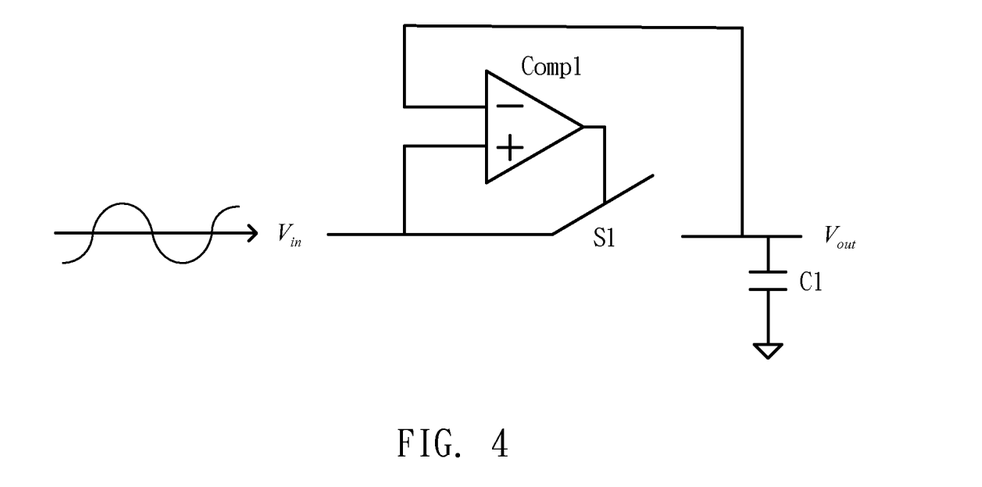
Figure 5:
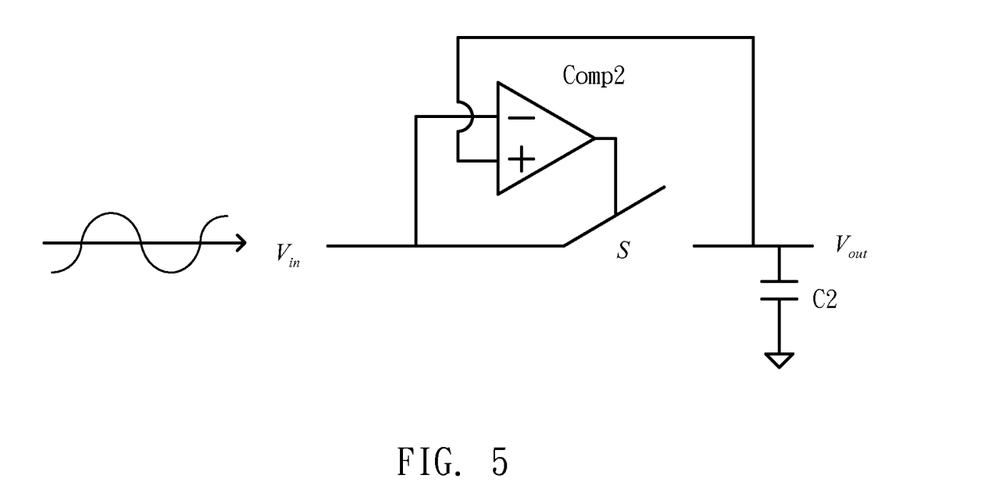

Accordingly, another example of the present invention employ signal filtering circuits shown in FIGS. 4 and 5. The signal filtering circuit may include a capacitor, a switch and a comparator. An input signal is inputted through the switch and held by the capacitor, and an output signal is generated. The comparator compares the input signal and the output signal to control the switch.

Referring to FIG. 4, when the positive half cycle of the input signal Vin is fed into the signal filtering circuit of FIG. 4, Vin>Vout, the first switch S1 is turned on, the capacitance of the first capacitor C1 will keep increasing until it reaches the maximum signal, such that the output signal Vout equals to Vmax. Thereafter, Vin<Vout, the first switch S1 is turned off, and the capacitance of the first capacitor C1 will remain at the maximum signal until the whole cycle is finished.

Similarly, referring to FIG. 5, when the negative half cycle of the input signal Vin is fed into the signal filtering circuit of FIG. 5, Vin<Vout, the second switch S2 is turned on, the capacitance of the second capacitor C2 will keep increasing until it reaches the minimum signal, such that the output signal Vout equals to Vmin. Thereafter, Vin>Vout, the second switch S2 is turned off, and the capacitance of the second capacitor C2 will remain at the minimum signal until the whole cycle is finished.

In the above descriptions, the positive half cycles and the negative half cycles of the input signal Vin need not be separately provided to the signal filtering circuits of FIGS. 4 and 5, respectively, that is, the same input signal Vin can be provided to the signal filtering circuits of FIGS. 4 and 5 simultaneously, and the signal filtering circuits of FIGS. 4 and 5 can output the maximum signal and the minimum signal, respectively.

Moreover, the signal filtering circuits of FIGS. 4 and 5 need not be synchronized with the input signal. All that is required is to obtain the maximum and the minimum signals in each detection cycle according to the frequency (or the period) of the input signal, so that the signal differences between the maximum and the minimum signals in a plurality of cycles can then be obtained. One with ordinary skill in the art can appreciate that the signal filtering circuits of FIGS. 4 and 5 may also be synchronized with the input signal; the present invention is not limited to these. However, in contrast to the prior art where the input signal has to be synchronized with the detecting circuit of the input signal, the present invention has the advantage of requiring no such synchronization. Furthermore, according to the above, in a best mode of the present invention, the period of the input signal and the detection period of the signal filtering circuits are the same. In another example of the present invention, the period of the input signal and the detection period of the signal filtering circuits are not the same. For example, the detection period of the signal filtering circuits is smaller than the period of the input signal or the detection period of the signal filtering circuits is larger than the period of the input signal.

In an example of the present invention, the input signal can be sent by a pointing device, such as an active capacitive pen, which has a predetermined frequency, such as the frequency of the input signal. When the active capacitive pen is close to a capacitive touch sensor, the capacitive touch sensor will receive the input signal, and the signal is passed through the signal filtering circuits of FIGS. 4 and 5, so that the maximum and the minimum signals are outputted at each detection cycle of the signal filtering circuits, the detection of at least one cycle is accumulated for determining the location of the active capacitive pen. The capacitive touch sensor may include horizontal or vertical long strips of electrodes intersecting each other at a plurality of intersections. In an example of the present invention, the signal filtering circuits are coupled to each of the horizontal electrodes and each of the vertical electrodes, respectively. When the active capacitive pen is near some of the electrodes, these electrodes detect an input signal, which is used for determining the location of the capacitive pen. For example, the signal difference between the maximum and the minimum signals in at least one cycle of each electrode is detected, and the signal differences are summed together to produce a detecting signal. As such, a plurality of horizontal and vertical detecting signals can be obtained, so that the centroid locations of the detecting electrodes in the horizontal and the vertical directions can then be determined. As another example, change in the detecting signal of each electrode before and after the approach of the pointing device is first determined to obtain a plurality of changes in the vertical and horizontal detecting signals, and then the centroid locations of the detecting electrodes in the horizontal and the vertical directions can be determined. The detecting signals are produced by a detecting circuit receiving the output signals generated by the signal filtering circuits.

The capacitive touch sensor may detect the approach or touch of a hand and an active capacitive pen in a multiplexing way. For example, detection of the hand and the detection of the active capacitive pen are performed alternately. In an example of the present invention, when a capacitive pen is detected, the location of the hand is not provided to a host or an operating system, thereby achieving palm-rejection writing by pen, which allows a palm of a user can press against the capacitive touch sensor while writing using an active capacitive pen, for example. In another example of the present invention, the locations of the hand and the active capacitive pen can be both provided to the host or the operating system.

In an example of the present invention, a device providing the input signal (e.g. the above pointing device) may detect the working frequency of the capacitive touch sensor, for example, detect a signal sent from the capacitive touch sensor while the capacitive touch sensor is performing hand detection in order to determine the working frequency of the capacitive touch sensor, and to further adjust the frequency of the input signal to be the same or close to the working frequency of the capacitive touch sensor, wherein the detection period can be adjusted by the working frequency.

In another example of the present invention, the above detecting circuit may detect the frequency of the input signal, and based on the frequency of the input signal, further adjust the detection period of the signal filtering circuits or the working frequency of the capacitive touch sensor.

Since low-frequency noise may affect the capacitive touch sensor through a hand, the signal filtering circuits of the present invention can effectively reduce or eliminate the interference of the low-frequency noise, and has the advantage that the input signal does not have to be synchronized with the signal filtering circuits.

Accordingly, according to the first embodiment of the present invention, a detecting device for suppressing the interference of low-frequency noise is provided, which includes a receiving circuit, a detecting circuit and a summing circuit. The receiving circuit is used for receiving a sine wave and sending it to the detecting circuit so that at least one signal detection can start at any arbitrary phase of the sine wave by the detecting circuit. Each signal detection lasts for a cycle. In an example of the present invention, the detecting circuit includes a first signal filtering circuit, a second signal filtering circuit and a signal difference generating circuit. The first signal filtering circuit filters out a maximum signal at each signal detection, while the second signal filtering circuit filters out a minimum signal at each signal detection. Thereafter, the signal difference generating circuit generates a respective signal difference between the maximum and the minimum signals for each signal detection. Moreover, the summing circuit sums up all the signal differences for the at least one signal detection to generate a complete detected signal as a single detected signal.

In an example of the present invention, the first signal filtering circuit includes: a first diode and a first capacitor. The first diode only allows the positive cycle of the sine wave to pass through, and the first capacitor maintains the maximum signal provided by the first diode during each signal detection. Conversely, the first diode does not allow the negative cycle of the signal to pass through. In addition, the second signal filtering circuit includes: a second diode and a second capacitor. The second diode only allows the negative cycle of the sine wave to pass through, and the second capacitor maintains the minimum signal provided by the second diode during each signal detection. Conversely, the second diode does not allow the positive cycle of the signal to pass through.

The signal difference generating circuit may be a differential amplifier, a differential analog converter or any circuit that can produce the difference between two signals.

In an example of the present invention, the first signal filtering circuit includes: a first capacitor, a first comparator and a first switch. The first capacitor holds the maximum signal received during each signal detection. In addition, the first comparator includes a first negative input, a first positive input and a first output, wherein the first positive input receives the sine wave, and the first negative input receives the maximum signal held by the first capacitor. Thus, the first switch provides the sine wave to the first capacitor according to the signal of the first output when the signal at the first positive input is greater than the signal at the first negative input. In addition, the second signal filtering circuit includes: a second capacitor, a second comparator and a second switch. The second capacitor holds the minimum signal received during each signal detection. In addition, the second comparator includes a second negative input, a second positive input and a second output, wherein the second negative input receives the sine wave, and the second positive input receives the minimum signal held by the second capacitor. Thus, the second switch provides the sine wave to the second capacitor according to the signal of the second output when the signal at the second positive input is greater than the signal at the second negative input.

Figure 6:
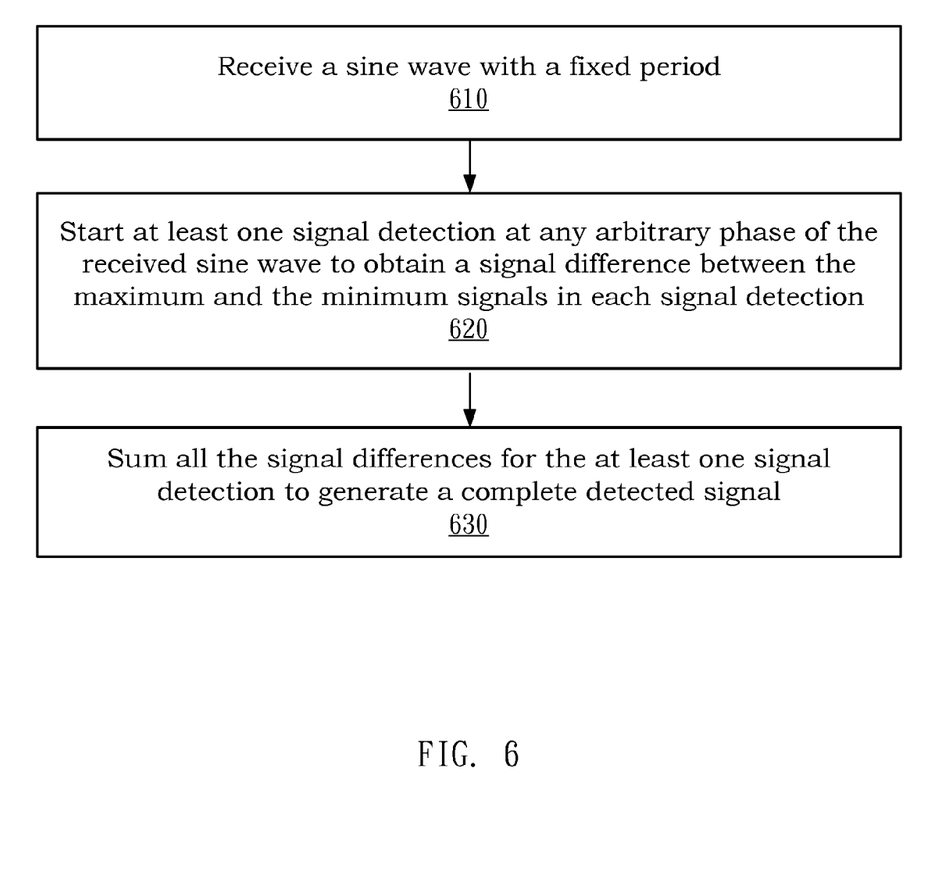
FIG. 6 is a flowchart illustrating a detecting method for suppressing the interference of low-frequency noise in accordance with the present invention.

Referring to FIG. 6, a detecting method for suppressing the interference of low-frequency noise in accordance with a second embodiment of the present invention is shown. As shown in step 610, a sine wave with a fixed period is received. Moreover, as shown in step 620, at least one signal detection is started at any arbitrary phase of the received sine wave. Each signal detection lasts for a cycle and includes: detecting a maximum signal and a minimum signal, and calculating a signal difference between the maximum and the minimum signals. Thereafter, as shown in step 630, all the signal differences for the at least one signal detection are summed up to generate a complete detected signal as a single detected signal. In an example of the present invention, the maximum signal is detected by the first signal filtering circuit described before, and the minimum signal is detected by the second signal filtering circuit described before.

Figure 7:
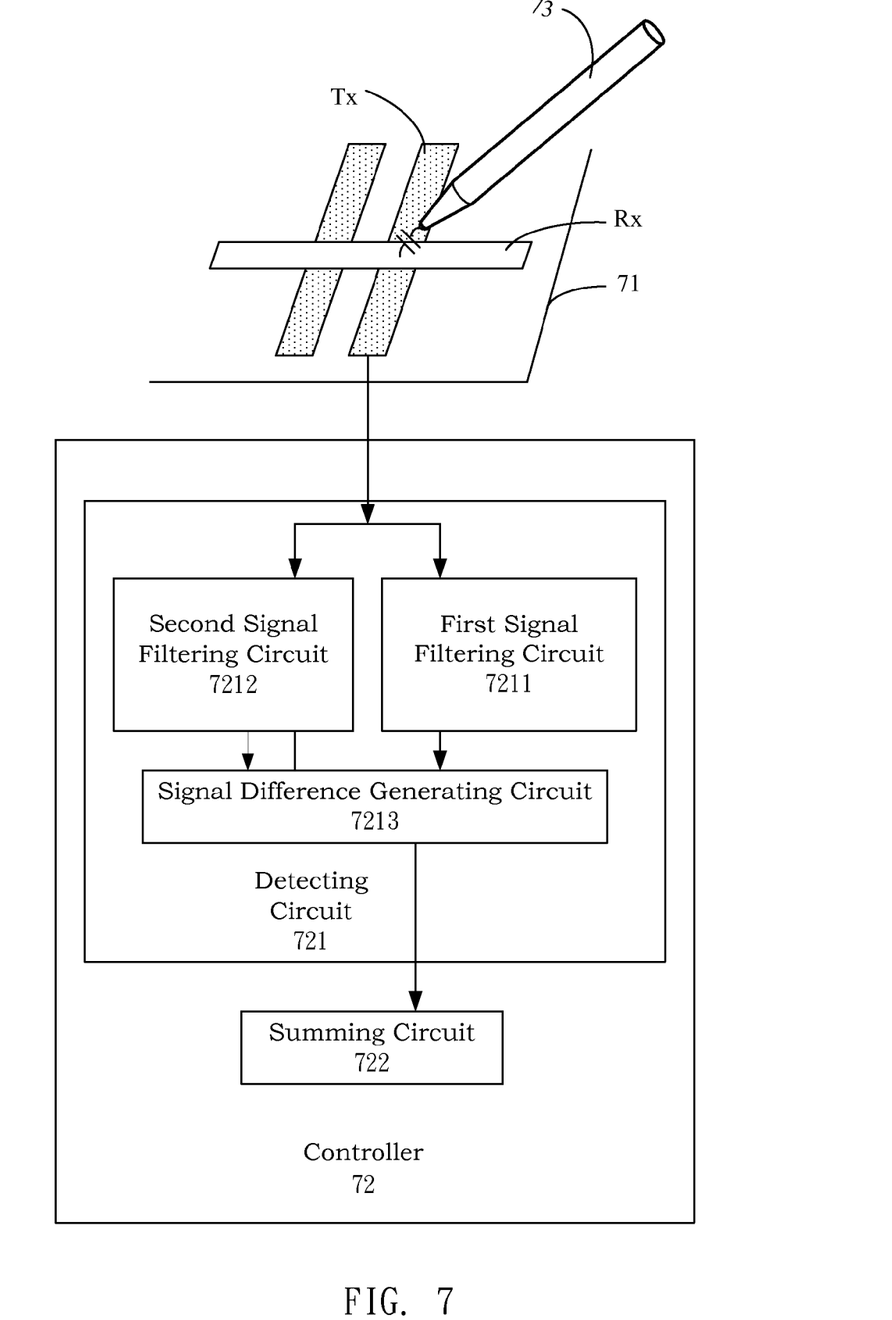
FIG. 7 is a block diagram illustrating a writing detecting device for suppressing the interference of low-frequency noise in accordance with the present invention.

Referring now to FIG. 7, a writing detecting device for suppressing the interference of low-frequency noise in accordance with a third embodiment of the present invention is shown, which includes: a pointing device 73, a touch screen 71 and a controller 72. The pointing device 73 provides a sine wave with a fixed period, and the controller 72 receives the sine wave through capacitive coupling, wherein the touch screen includes a plurality of conductive strips composed of a plurality of vertical conductive strips Tx and a plurality of horizontal conductive strips Rx. The sine wave is received by said conductive strips. The controller 72 includes: said detecting circuit 721 and said summing circuit 722. The controller 72 performs at least one signal detection with an internal clock cycle (like the working frequency mentioned before). The phase of the internal clock and the phase of the sine wave can be asynchronous, and the period of the internal clock and the period of the sine wave can be the same. In an example of the present invention, the controller 72 adjusts the period of the internal clock based on the period of the sine wave. In another example of the present invention, the controller 72 further includes providing a driving signal to one conductive strip or a set of conductive strips based on the period of the sine wave, wherein the pointing device 73 receives the driving signal via capacitively coupling or electromagnetically induction with the one conductive strip or the set of conductive strips being provided with the driving signal, and changes the period of the sine wave based on the period of the driving signal. Moreover, the detecting circuit 721 includes the first signal filtering circuit 7211, the second signal filtering circuit 7212 and the signal difference generating circuit 7213 as described before, their details have already been described in the earlier descriptions and thus will not repeated.

In an example of the present invention, said sine wave can also be provided by said driven conductive strip(s). In other words, the driving signal provided to the driven conductive strip(s) can be a sine wave, and the detecting circuit can receive the sine wave through capacitive coupling of the detected conductive strip(s), and the detecting circuit may start the single detection, i.e. said at least one signal detection, at any arbitrary phase of the received sine wave.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A writing detecting device for suppressing interference of low-frequency noise, comprising:
   a pointing device for providing a sine wave with a fixed period;
   a touch screen including a plurality of conductive strips composed of a plurality of vertical conductive strips and a plurality of horizontal conductive strips for receiving the sine wave through capacitive coupling; and
   a controller including:
      a detecting circuit for a plurality of signal detections, starting at least one of said signal detections at any arbitrary phase of the received sine wave, each signal detection lasting for a cycle, wherein the detecting circuit includes:
         a first signal filtering circuit for filtering out a maximum signal in one cycle starting from the arbitrary phase at each signal detection;
         a second signal filtering circuit for filtering out a minimum signal in one cycle starting from the arbitrary phase at each signal detection; and
         a signal difference generating circuit for generating a respective signal difference between the maximum and the minimum signals for each signal detection; and
      a summing circuit for summing all the signal differences for the plurality of signal detections to generate a complete detected signal.

2. The detecting device of claim 1, wherein the first signal filtering circuit includes:
   a first diode that only allows the positive cycle of the sine wave to pass through; and
   a first capacitor for holding the maximum signal provided by the first diode during each signal detection.

3. The detecting device of claim 1, wherein the second signal filtering circuit includes:
   a second diode that only allows the negative cycle of the sine wave to pass through; and
   a second capacitor for holding the minimum signal provided by the second diode during each signal detection.

4. The detecting device of claim 1, wherein the first signal filtering circuit includes:
   a first capacitor for holding the maximum signal received during each signal detection;
   a first comparator including a first negative input, a first positive input and a first output, wherein the first positive input receives the sine wave, and the first negative input receives the maximum signal held by the first capacitor; and
   a first switch for providing the sine wave to the first capacitor according to a signal of the first output when the signal at the first positive input is greater than the signal at the first negative input.

5. The detecting device of claim 1, wherein the second signal filtering circuit includes:
   a second capacitor for holding the minimum signal received during each signal detection;
   a second comparator including a second negative input, a second positive input and a second output, wherein the second negative input receives the sine wave, and the second positive input receives the minimum signal held by the second capacitor; and a second switch for providing the sine wave to the second capacitor according to a signal of the second output when the signal at the second positive input is greater than the signal at the second negative input.

6. The detecting device of claim 1, wherein the controller performs the plurality of signal detections with an internal clock cycle, and the phase of the internal clock is asynchronous with the phase of the sine wave.

7. The detecting device of claim 6, wherein the period of the internal clock and the period of the sine wave are the same.

8. The detecting device of claim 7, wherein the controller adjusts the period of the internal clock based on the period of the sine wave.

9. The detecting device of claim 7, wherein the controller further includes providing a driving signal to one conductive strip or a set of conductive strips based on the period of the sine wave, wherein the pointing device receives the driving signal via capacitively coupling or electromagnetically induction with the one conductive strip or the set of conductive strips being provided with the driving signal, and changes the period of the sine wave based on the period of the driving signal.

10. A detecting method for suppressing interference of low-frequency noise, comprising:
   receiving a sine wave with a fixed period;
   performing a plurality of signal detections, starting at least one of said signal detections at any arbitrary phase of the received sine wave, each signal detection lasting for a cycle and including:
      detecting a maximum signal and a minimum signal in one cycle starting from the arbitrary phase; and
      calculating the signal difference between the maximum and the minimum signals; and
   summing all the signal differences for the plurality of signal detections to generate a complete detected signal.

11. The detecting method of claim 10, wherein the maximum signal is detected by a first signal filtering circuit, the first signal filtering circuit includes:
   a first diode that only allows the positive cycle of the sine wave to pass through; and
   a first capacitor for holding the maximum signal provided by the first diode during each signal detection.

12. The detecting method of claim 10, wherein the minimum signal is detected by a second signal filtering circuit, the second signal filtering circuit includes:
   a second diode that only allows the negative cycle of the sine wave to pass through; and
   a second capacitor for holding the minimum signal provided by the second diode during each signal detection.

13. The detecting method of claim 10, wherein the maximum signal is detected by a first signal filtering circuit, the first signal filtering circuit includes:
   a first capacitor for holding the maximum signal received during each signal detection;
   a first comparator including a first negative input, a first positive input and a first output, wherein the first positive input receives the sine wave, and the first negative input receives the maximum signal held by the first capacitor; and
   a first switch for providing the sine wave to the first capacitor according to a signal of the first output when the signal at the first positive input is greater than the signal at the first negative input.

14. The detecting method of claim 10, wherein the minimum signal is detected by a second signal filtering circuit, the second signal filtering circuit includes:
   a second capacitor for holding the minimum signal received during each signal detection;
   a second comparator including a second negative input, a second positive input and a second output, wherein the second negative input receives the sine wave, and the second positive input receives the minimum signal held by the second capacitor; and
   a second switch for providing the sine wave to the second capacitor according to a signal of the second output when the signal at the second positive input is greater than the signal at the second negative input.

15. A detecting device for suppressing interference of low-frequency noise, comprising:
   a receiving circuit for receiving a sine wave;
   a detecting circuit for a plurality of signal detections, starting at least one of said signal detections at any arbitrary phase of the received sine wave, each signal detection lasting for a cycle, wherein the detecting circuit includes:
      a first signal filtering circuit for filtering out a maximum signal in one cycle starting from the arbitrary phase at each signal detection;
      a second signal filtering circuit for filtering out a minimum signal in one cycle starting from the arbitrary phase at each signal detection; and
      a signal difference generating circuit for generating a respective signal difference between the maximum and the minimum signals for each signal detection; and
   a summing circuit for summing all the signal differences for the plurality of signal detections to generate a complete detected signal.

16. The detecting device of claim 15, wherein the first signal filtering circuit includes:
   a first diode that only allows the positive cycle of the sine wave to pass through; and
   a first capacitor for holding the maximum signal provided by the first diode during each signal detection.

17. The detecting device of claim 15, wherein the second signal filtering circuit includes:
   a second diode that only allows the negative cycle of the sine wave to pass through; and
   a second capacitor for holding the minimum signal provided by the second diode during each signal detection.

18. The detecting device of claim 15, wherein the first signal filtering circuit includes:
   a first capacitor for holding the maximum signal received during each signal detection;
   a first comparator including a first negative input, a first positive input and a first output, wherein the first positive input receives the sine wave, and the first negative input receives the maximum signal held by the first capacitor; and
   a first switch for providing the sine wave to the first capacitor according to a signal of the first output when the signal at the first positive input is greater than the signal at the first negative input.

19. The detecting device of claim 15, wherein the second signal filtering circuit includes:
   a second capacitor for holding the minimum signal received during each signal detection;
   a second comparator including a second negative input, a second positive input and a second output, wherein the second negative input receives the sine wave, and the second positive input receives the minimum signal held by the second capacitor; and a second switch for providing the sine wave to the second capacitor according to a signal of the second output when the signal at the second positive input is greater than the signal at the second negative input.

20. The detecting device of claim 18, wherein the second signal filtering circuit includes:

a second capacitor for holding the minimum signal received during each signal detection;

a second comparator including a second negative input, a second positive input and a second output, wherein the second negative input receives the sine wave, and the second positive input receives the minimum signal held by the second capacitor; and a second switch for providing the sine wave to the second capacitor according to a signal of the second output when the signal at the second positive input is greater than the signal at the second negative input.

* * * * *